(12) United States Patent
Jhon et al.

(10) Patent No.: US 10,753,804 B2
(45) Date of Patent: Aug. 25, 2020

(54) TERAHERTZ (THZ) WAVE DETECTING SENSOR AND THZ WAVE DETECTING DEVICE INCLUDING THE SAME

(71) Applicant: KOREA INSTITUTE OF SCIENCE AND TECHNOLOGY, Seoul (KR)

(72) Inventors: Young Min Jhon, Seoul (KR); Minah Seo, Seoul (KR); Young In Jhon, Seoul (KR)

(73) Assignee: KOREA INSTITUTE OF SCIENCE AND TECHNOLOGY, Seoul (KR)

(*) Notice: Subject to any disclaimer, the term of this patent is extended or adjusted under 35 U.S.C. 154(b) by 0 days.

(21) Appl. No.: 16/292,328

(22) Filed: Mar. 5, 2019

(65) Prior Publication Data
US 2020/0158576 A1 May 21, 2020

(30) Foreign Application Priority Data
Nov. 20, 2018 (KR) .................. 10-2018-0143754

(51) Int. Cl.
*G01J 5/02* (2006.01)
*G01J 5/12* (2006.01)
*G01J 5/34* (2006.01)
*H01L 35/26* (2006.01)

(52) U.S. Cl.
CPC . *G01J 5/02* (2013.01); *G01J 5/12* (2013.01); *G01J 5/34* (2013.01); *H01L 35/26* (2013.01)

(58) Field of Classification Search
CPC ....... G01J 5/02; G01J 5/12; G01J 5/34; H01L 35/26
See application file for complete search history.

(56) References Cited

FOREIGN PATENT DOCUMENTS

| JP | 2014163674 A | 9/2014 |
|---|---|---|
| KR | 1020170102462 A | 9/2017 |

OTHER PUBLICATIONS

Babak Anasori et al., "2D metal carbides and nitrides (MXenes) for energy storage", Nature Reviews, Jan. 2017, 17 pages, vol. 2, No. 16098.
Guangjiang Li et al., "Equilibrium and non-equilibrium free carrier dynamics in 2D Ti3C2Tx MXenes: THz spectroscopy study," 2D Materials, Jun. 2018, pp. 1-8, vol. 5, No. 035043.
Korean Notice of Allownace for KR Application No. 10-2018-0143757 dated Oct. 25, 2019, citing the above references.

*Primary Examiner* — Mark R Gaworecki
(74) *Attorney, Agent, or Firm* — Cantor Colburn LLP

(57) ABSTRACT

The present invention relates to a terahertz (THz) wave detecting sensor including a MXene material represented by the following Formula 1 as a sensing material:

$$M_{(n+1)}X_n,$$  [Formula 1]

wherein, in Formula 1, M is at least one transition metal selected from early transition metal elements, X is at least one selected from C and N, and n is an integer selected from 1 to 3.

11 Claims, 12 Drawing Sheets
(8 of 12 Drawing Sheet(s) Filed in Color)

TERAHERTZ (THZ) WAVE DETECTING SENSOR AND THZ WAVE DETECTING DEVICE INCLUDING THE SAME

CROSS-REFERENCE TO RELATED APPLICATION

This application claims priority to and the benefit of Korean Patent Application No. 2018-0143754, filed on Nov. 20, 2018, the disclosure of which is incorporated herein by reference in its entirety.

BACKGROUND

1. Field of the Invention

The present invention relates to a terahertz (THz) wave detecting sensor using an MXene material as a high sensitivity sensing material and a THz wave detecting device including the same.

2. Discussion of Related Art

A terahertz (THz) wave is an electromagnetic wave in a region between an infrared wave and a microwave. The THz wave has both straightness of the infrared wave and penetrability of the microwave. Accordingly, the THz wave may pass through most nonmetallic materials like the microwave and may provide fine spatial resolution unlike the microwave.

Therefore, when the THz wave is used, it is possible to manufacture a T-ray nondestructive inspection system capable of scanning most nonmetallic materials by allowing the THz wave to pass through the nonmetallic materials like an X-ray without radioactivity. In addition, a large number of molecules, which are not discriminated in infrared region spectroscopy, may be discriminated in a THz region (generally, 0.3 THz to 3.0 THz), and thus, a THz wave-based spectrometer may become a powerful molecular discrimination device. Recently, based on this, molecular detection technology has been developed which may accurately and quickly discriminate detailed subtypes of various avian flu viruses using the THz wave spectrometer. However, a THz laser generating and sensing device for THz spectroscopic analysis has a unique and complex structure different from that of a general laser generating and sensing device due to characteristics of the THz wave. Meanwhile, research and development of a light detecting device used in THz imaging technology, which does not need to be distinguished for each frequency, is far behind research of a sensor device in other wavelength ranges. This is because materials capable of efficiently absorbing and detecting the THz wave are rare and it is very difficult to develop new materials having excellent performance Therefore, research to find materials capable of effectively detecting the THz wave may be a key part of development and research of the THz wave sensing device.

MXene materials are recently developed two-dimensional transition-metal carbides, carbonitrides and nitrides. The MXene material exhibits excellent performance in various application fields such as fields of an electrode material of a secondary battery, a supercapacitor, a porous membrane, and a catalyst due to excellent electronic and chemical properties thereof. However, physical properties of the MXene materials have not been sufficiently researched and understood. In particular, there is almost no characteristic analysis and application in laser optics.

SUMMARY OF THE INVENTION

A difficulty in developing a terahertz (THz) wave detecting sensor is one main factor contributing to a THz detecting material having excellent physical properties being very difficult to find. The present invention is directed to providing a THz wave detecting sensor having a simple structure and excellent performance by finding and using a new THz wave detecting material and a THz wave detecting device including the same.

Specifically, the present inventors have proven that an MXene material has excellent THz wave absorption performance by performing density functional theory calculations and have found that a THz laser light detecting device based on the MXene material may be developed due to excellent photo-thermal conversion efficiency, excellent photo-thermoelectric conversion efficiency, and high energy level density of states (DOS) of electrons near the Fermi energy level of the MXene material. In addition, the present inventors have confirmed that a two-dimensional material, i.e., the MXene material has excellent THz wave detection performance irrespective of a degree of stacking of the MXene materials (including bulky materials) using the theory calculations and thus have proved that the development of the device is very easy.

Therefore, the present invention is directed to providing a THz wave detecting sensor using an MXene material as a high sensitivity sensing material and a THz wave detecting device including the same.

An embodiment of the present invention provides a THz wave detecting sensor including an MXene material represented by the following Formula 1 as a sensing material:

$$M_{(n+1)}X_n, \qquad \text{[Formula 1]}$$

wherein, in Formula 1, M is at least one transition metal selected from early transition metal elements, X is at least one selected from C and N, and n is an integer selected from 1 to 3.

Another embodiment of the present invention provides a THz wave detecting device including the THz wave detecting sensor.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1A:
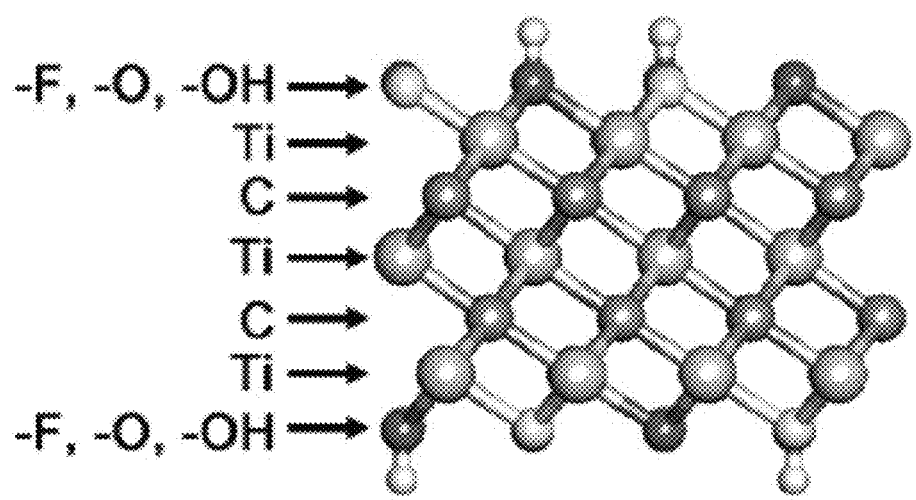
FIG. 1A illustrates an example of a detailed structure of a monolayer $Ti_3C_2$ MXene material in which —F and —OH chemical functional groups are bonded to a surface thereof.

In the present specification, a description of a certain portion "including" certain elements means being capable of further including other elements and does not exclude other elements unless particularly stated to the contrary.

It should be appreciated that terms or words used in the specification and claims should not be limited and construed as having common or dictionary meanings and should be construed as having meanings and concepts according to the technical spirit of the present invention based on the principle that the inventor can appropriately define the concept of each term so as to describe the present invention in the best manner. Embodiments described in the present specification and configurations illustrated in the drawings are merely the most exemplary embodiment of the present invention, rather than representing all the technical concepts of the present invention, so the present invention is meant to cover all modifications, similarities, and alternatives included in the spirit and scope of the present invention at the time of the filing of the present invention.

Hereinafter, the present invention will be described in detail.

As described above, the present inventors have proved and shown for the first time in the world that an MXene material may be used as a core sensor material of a terahertz (THz) wave detecting device due to excellent light absorbance, excellent photo-thermal conversion efficiency, and excellent photo-thermoelectric conversion efficiency thereof with respect to the THz wave, thereby completing the present invention.

An embodiment of the present invention provides a THz wave detecting sensor including an MXene material represented by Formula 1 below as a sensing material.

$$M_{(n+1)}X_n \qquad \text{[Formula 1]}$$

In Formula 1, M is at least one transition metal selected from early transition metal elements, X is at least one selected from C and N, and n is an integer selected from 1 to 3.

According to an embodiment of the present invention, M in Formula 1 may include at least one transition metal selected from the group consisting of Sc, Ti, V, Cr, Zr, Nb, Mo, Hf, and Ta.

According to an embodiment of the present invention, M may include at least one transition metal. When the MXene material includes at least two transition metals, the MXene material may have various forms, such as a form in which each layer of the MXene material includes a mixture of at least two transition metals and a form in which a surface layer and an inner layer include different metals.

According to an embodiment of the present invention, X may concurrently include C and N. In this case, the number of atoms of each of C and N may be 1 or 2.

According to an embodiment of the present invention, at least one chemical functional group selected from among —O, —OH, and —F may be bonded to a surface of the MXene material.

A range of the MXene material is not limited thereto and may include all ranges of MXene reported through a paper or an academic society (for example, see Nature Review Materials, 2017, 2, 16098). Specifically, according to an embodiment of the present invention, the MXene material may include at least one selected from among Ti$_2$C, Ti$_3$C$_2$, Ti$_4$C$_3$, and Mo$_2$TiC$_2$.

According to an embodiment of the present invention, the MXene material may have a two-dimensional monolayer structure. A monolayer in the MXene material having the monolayer structure does not mean that an atomic layer is one but rather means that the number of layers of the two-dimensional MXene material is one. In addition, according to an embodiment of the present invention, the MXene material may have a layered structure in which two-dimensional monolayer MXene materials are stacked. The layered MXene material may be prepared through a known method such as a drop casting method.

According to an embodiment of the present invention, the layered MXene material may include only a chemical functional group between layers. Furthermore, the layered MXene material may further include a chemical functional group, a water molecule, or an ion between the layers.

According to an embodiment of the present invention, the MXene material may be provided so as to be dispersed in a polymer matrix. Specifically, the MXene material may be dispersed in a matrix structure of a polymer such as polyvinyl alcohol (PVA) or polyvinyl pyrrolidone (PVP). That is, the THz wave detecting sensor may be a sensor in which the MXene material is dispersed in the polymer matrix.

Another embodiment of the present invention provides a THz wave detecting device including the THz wave detecting sensor. Specifically, the THz wave detecting device may include a THz wave detecting system including the THz wave detecting sensor.

According to an embodiment of the present invention, the THz wave detecting sensor may be a bolometer-type THz wave detecting sensor. That is, the THz wave detecting device may be a bolometer-type THz wave detecting device or a photo-thermoelectric THz wave detecting device.

Figure 5:
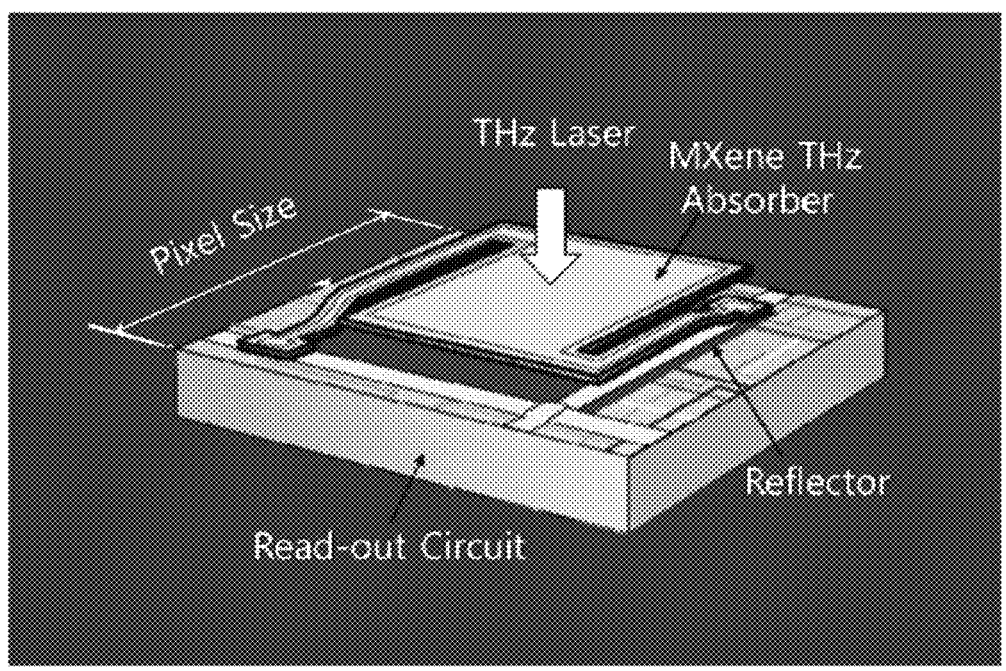
FIG. 5 illustrates an example of a bolometer-type THz wave detecting device based on an MXene material.

FIG. 5 illustrates an example of a bolometer-type THz wave detecting device based on an MXene material. The bolometer-type THz wave detecting device may detect a THz wave using a photo-thermal effect of the MXene material. Specifically, a THz wave detecting sensor including the MXene material capable of efficiently performing photo-thermal conversion on the THz wave may be manufactured in the form of a thin film so as to float in the air without coming into thermal contact with its surroundings as much as possible. Thus, a temperature may be easily raised when a THz laser wave is incident on the THz wave detecting sensor, thereby sensing the temperature increase to detect the THz wave. In particular, according to technology for performing imaging by collecting microbolometer modules having such a structure per pixel in an array, high resolution THz imaging may be performed even at a low cost.

According to an embodiment of the present invention, the THz wave detecting device may have a structure in which a THz wave bolometer-type detecting sensor and an antenna are coupled.

Figure 6:
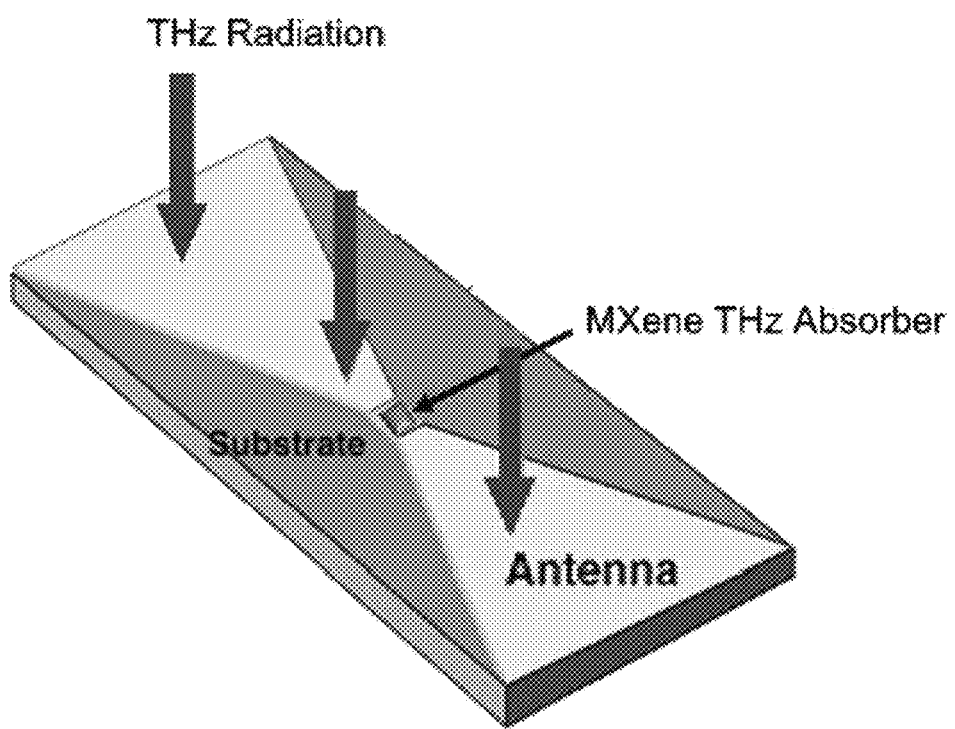
FIG. 6 illustrates an example of a bolometer-type THz wave detecting sensor based on an MXene material, in which an antenna is coupled to improve efficiency.

FIG. 6 illustrates an example of a bolometer-type THz wave detecting sensor based on an MXene material, in which an antenna is coupled to improve efficiency. The bolometer-type THz wave detecting device may effectively detect a THz wave by disposing a bolometer sensor in a gap between specific-shaped THz antennas which are effective for collecting an electromagnetic wave and intensively heating the bolometer sensor.

According to an embodiment of the present invention, the THz wave detecting sensor, to which the antenna is coupled, may be provided in a form in which a plurality of THz wave detecting sensors are connected in series or in parallel. Specifically, the THz wave detecting sensor, to which the antenna is coupled, may be provided in an array in a form in which the plurality of THz wave detecting sensors are connected in series or in parallel.

Figure 8A:
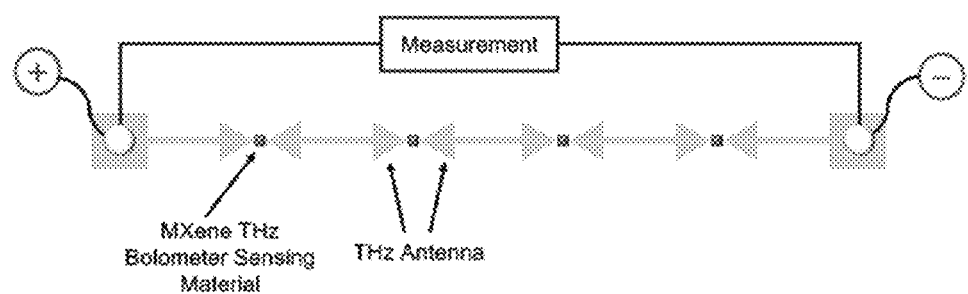
FIG. 8A illustrates a structure of THz antenna-coupled bolometer-type THz wave detecting sensors connected in series.
Figure 8B:
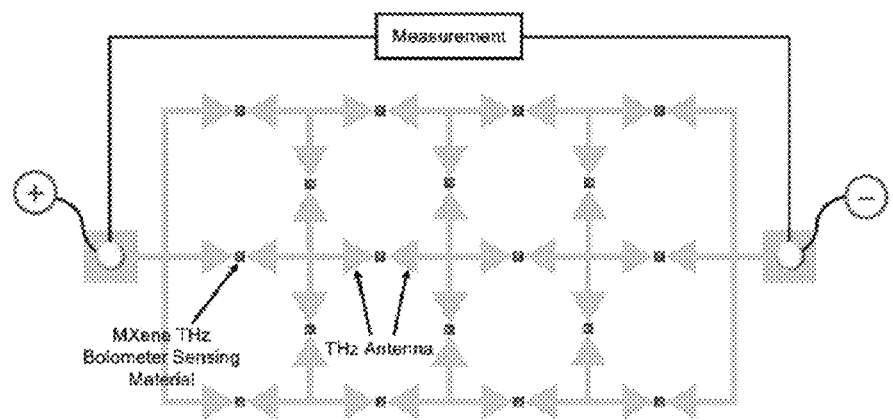
FIG. 8B illustrates a structure of an array in which antenna-coupled bolometer-type THz wave detecting sensors are connected in series and in parallel.

FIG. 8A illustrates a structure of THz antenna-coupled bolometer-type THz wave detecting sensors connected in series in order to improve THz wave detection performance. Furthermore, FIG. 8B illustrates a structure of an array in which antenna-coupled bolometer-type THz wave detecting sensors are connected in series and in parallel.

According to an embodiment of the present invention, the bolometer-type THz wave detecting device may be a device in which a metamaterial is coupled to the THz wave detecting sensor. As a result, it is possible to improve detection performance with respect to a THz wave with a specific wavelength.

Figure 7:
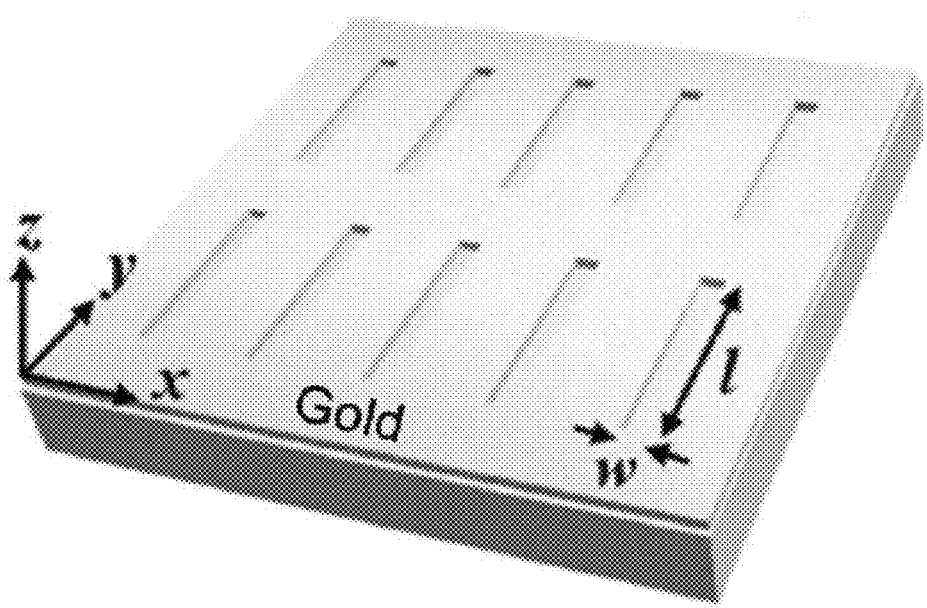
FIG. 7 illustrates an example of a metamaterial capable of amplifying, transmitting, and reflecting a specific THz wavelength.

FIG. 7 illustrates an example of a metamaterial capable of amplifying, transmitting, and reflecting a specific THz wavelength. Specifically, when the metamaterial of FIG. 7 is coupled to the detecting sensor of the bolometer-type THz detecting device, it is possible to manufacture a detecting sensor specialized for a specific wavelength. According to an embodiment of the present invention, the THz wave detecting device may be a photo-thermoelectric THz wave detecting device.

Excluding the above-described THz wave detecting sensor, a structure known in the art may be applied to the bolometer-type THz wave detecting device and the photo-thermoelectric THz wave detecting device.

In order to prove an effect of the THz wave detecting sensor, the present inventors have analyzed the optical properties and electronic structure characteristics of a representative MXene material, i.e., $Ti_3C_2$, with respect to a THz wave in detail by performing systematic density functional theory calculations. Specifically, a $Ti_3C_2$ material, in which —F and —OH chemical functional groups are coupled to a surface thereof, was considered as an MXene material.

Figure 1B:
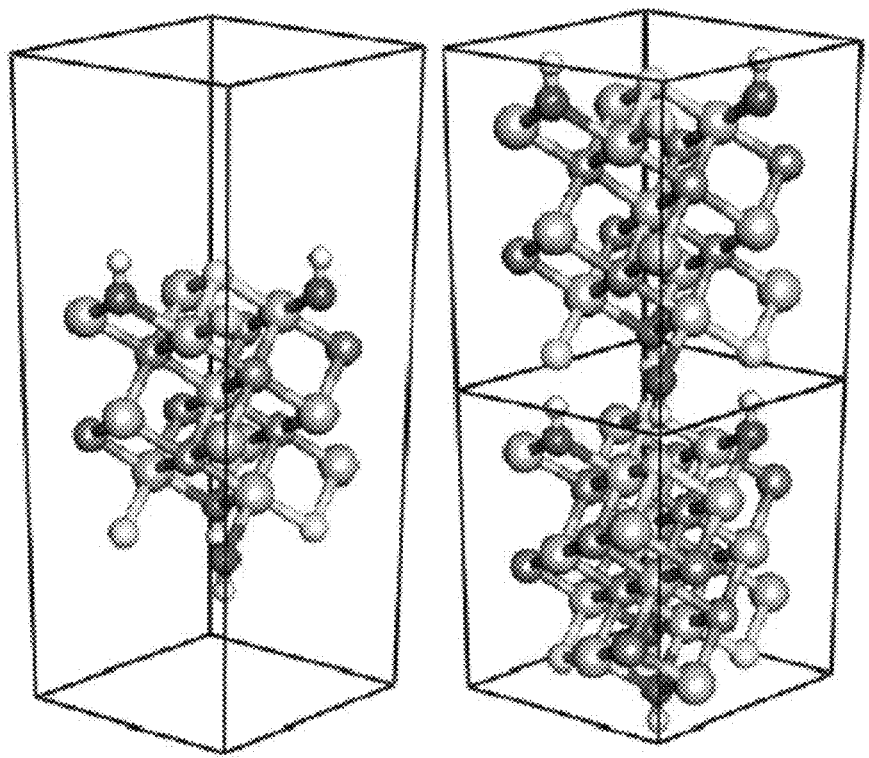
FIG. 1B illustrates a monolayer $Ti_3C_2$ MXene material (left side) and a layered $Ti_3C_2$ MXene material (right side) in which monolayer $Ti_3C_2$ MXene materials are stacked.

FIG. 1 illustrates monolayer $Ti_3C_2$ and layered $Ti_3C_2$, in which —F and —OH chemical functional groups are coupled to a surface thereof. Specifically, FIG. 1A illustrates a detailed structure of the monolayer $Ti_3C_2$, and FIG. 1B illustrates the monolayer $Ti_3C_2$ (left side) and the layered $Ti_3C_2$ (right side). The layered $Ti_3C_2$ may preserve a two-dimensional feature well while maintaining a stable structure due to a hydrogen bond and may have a sufficient optical absorption capacity due to an increase in an amount of material due to stacking.

Furthermore, systematic density functional theory calculations were performed on optical absorption of the monolayer $Ti_3C_2$ and the layered $Ti_3C_2$ as shown in FIG. 1 with respect to a THz wave in a range of 0.3 THz to 3 THz (i.e., 0.0012 eV to 0.012 eV). Optical absorption of the above-described MXene material with respect to a wavelength in a THz region has not been researched until now. Kubo-Greenwood Expression 1, the following Expression 2, and the following Expression 3 derived for the research were used:

$$x_{i,j}(\omega) = (e^2\hbar^4)/(m_0^2\varepsilon_0 V\omega^2)\sum_{nm}(f(E_m)f(E_n))/(E_{nm}\hbar\omega i\hbar\Gamma)\pi_{inm}\pi_{jnm} \quad (1)$$

$$\varepsilon(\omega) = 1 + x(\omega) \quad (2)$$

$$\eta(\omega) + i\kappa(\omega) = \sqrt{\varepsilon(\omega)}. \quad (3)$$

$x(\omega)$, $\varepsilon(\omega)$, $\eta(\omega)$, $\kappa(\omega)$ are frequency dependent sensitivity, a dielectric constant, a refractive index, and an extinction coefficient, respectively, and $\pi_{imn}$ is an i component of a dipole matrix element between states m and n, f is the Fermi function, $\Gamma$ is an extension parameter, and V is a volume element.

Optical absorption of each of the monolayer $Ti_3C_2$ and the layered $Ti_3C_2$ was calculated in a range of 0.0012 eV to 0.012 eV using the above relational expressions.

Figure 2A:
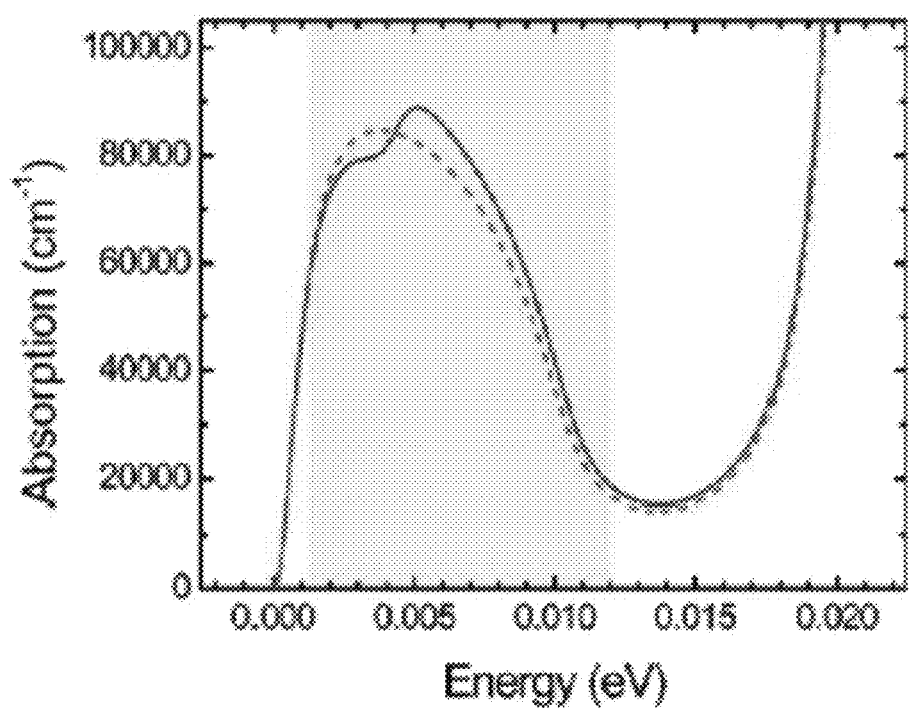
FIG. 2A illustrates a monolayer $Ti_3C_2$ MXene material and a optical absorption spectrum in a terahertz (THz) band.
Figure 2B:
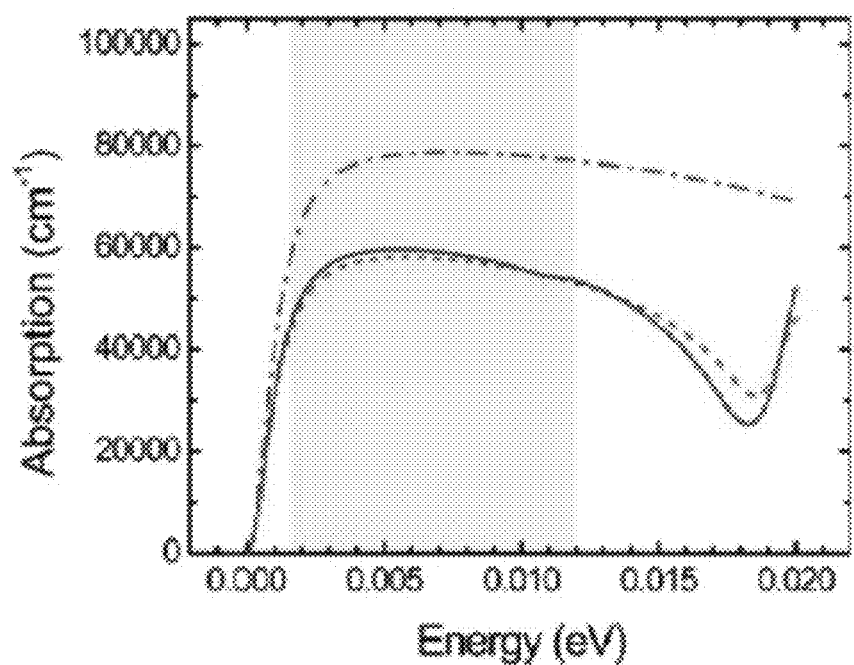
FIG. 2B illustrates optical absorption spectra of a stacked Ti$_3$C$_2$ MXene material and stacked graphene (green dashed dotted line)
Figure 2C:
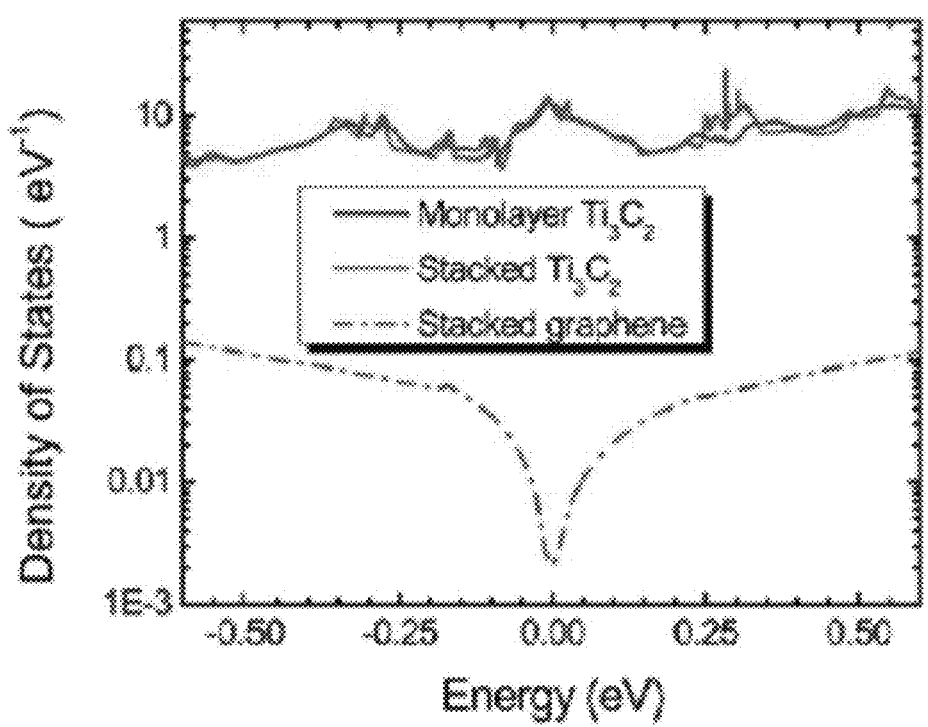
FIG. 2C illustrates density of states (DOS) of electrons near the Fermi energy level of each of the monolayer Ti$_3$C$_2$ MXene material, the stacked Ti$_3$C$_2$ MXene material, and the stacked graphene.

FIG. 2A illustrates a monolayer $Ti_3C_2$ MXene material and the optical absorption spectrum in a THz band. FIG. 2B illustrates the optical absorption spectra of a stacked $Ti_3C_2$ MXene material and stacked graphene (green dashed dotted line). FIG. 2C illustrates density of states (DOS) of electrons near the Fermi energy level of each of the monolayer $Ti_3C_2$ MXene material, the stacked $Ti_3C_2$ MXene material, and the stacked graphene. Regarding FIGS. 2A to 2C, it is shown that the $Ti_3C_2$ MXene materials have a very excellent optical absorption performance in a THz region. It can be seen that a spin-orbit interaction effect (red dotted lines of FIGS. 2A and 2B) capable of changing a low energy electron state has little effect on optical absorption properties in the THz range of the monolayer $Ti_3C_2$ and the layered $Ti_3C_2$ with respect to a THz wave.

According to electron DOS spectrum analysis, the stacked graphene exhibits lower electron density near the Fermi energy level as compared with the $Ti_3C_2$. On the other hand, the monolayer $Ti_3C_2$ and the layered $Ti_3C_2$ have electronic DOS of several orders of magnitude higher near the Fermi energy level and thus have a larger THz wave absorption capacity. Therefore, even when an MXene material, in which two-dimensional materials are stacked, has the form of a thin film, the MXene material may provide optimized energy level DOS of electrons capable of absorbing almost all of THz laser light, i.e., a THz wave that is instantaneously and intensively incident thereon, thereby maximizing detection efficiency of the THz laser light. In particular, the high DOS near the Fermi energy level provided by the MXene material may maximize detection efficiency of the THz wave in low power THz laser light generally used in THz spectroscopy as well as in high power THz laser light used in THz imaging technology.

It could be seen that when the same kinds of surface chemical groups were clustered, the absorption of the THz wave was increased up to 3 times as compared with the absorption of the THz wave when the same kinds of surface chemical groups were not clustered. Furthermore, it could be confirmed that optical absorption with respect to the THz wave was very high regardless of the existence of water molecules present between layers of the layered $Ti_3C_2$.

From the above results, it can be seen that the MXene materials including $Ti_3C_2$ known to exhibit similar properties as $Ti_3C_2$ have excellent THz wave absorption detecting performance.

As described above, it can be seen that a monolayer or layered MXene material may effectively detect a THz wave, and a THz wave detecting sensor using the same may realize an excellent effect. Furthermore, it can be expected that an MXene material-polymer composite, in which a MXene material is provided so as to be dispersed in a polymer matrix, in which polymer may be packed together with an individual monolayer or layered MXene material, may be applied as a THz wave detecting sensor.

In order to detect a THz wave, efficiency of absorbing the THz wave as well as efficiency of converting the THz wave into heat or electricity should be high. In particular, a temperature may be effectively raised with respect to photons with very small energy like the THz wave.

Figure 3A:
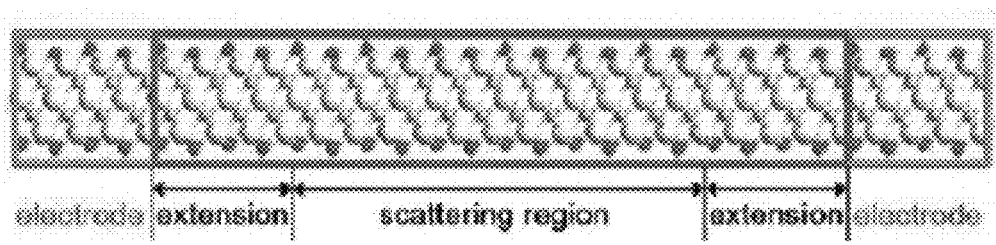
FIG. 3A illustrates a device for confirming thermoelectric properties of a layered Ti$_3$C$_2$ material.
Figure 3B:
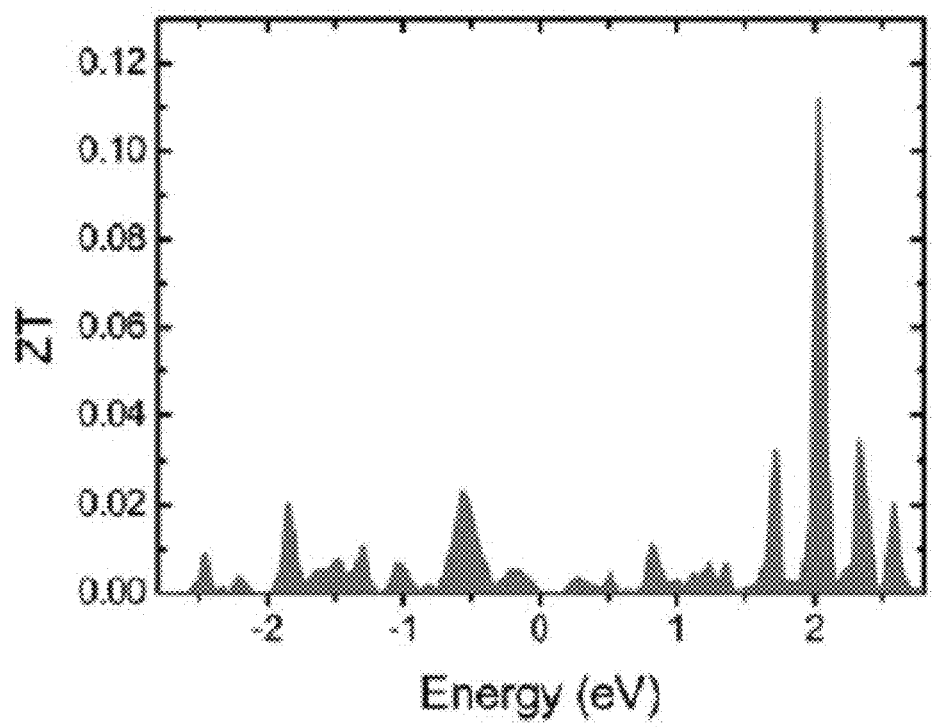
FIG. 3B illustrates a thermoelectric figure of merit (ZT) spectrum of the layered Ti$_3$C$_2$ material.

In order to confirm thermoelectric properties of a layered $Ti_3C_2$ material in which —O and —OH functional groups are bonded to a surface thereof, a device system having a channel region and an electrode region was configured, and then, electron mobility characteristics were calculated when a source-drain voltage was applied under non-equilibrium Green's function regime. FIG. 3A is a side view illustrating a device for confirming thermoelectric properties of a layered $Ti_3C_2$ flake, and FIG. 3B is a graph showing a thermoelectric figure of merit (ZT) spectrum of the layered $Ti_3C_2$ material. The thermoelectric figure of merit (ZT) of the layered $Ti_3C_2$ material is defined by Expression 4 below.

$$ZT=S^2\sigma T/G \quad (4).$$

In Expression 4, S is a Seebeck coefficient, σ is thermal conductivity, G is thermal conductivity, and T is temperature.

In order to avoid many calculations required in a system of the device according to FIG. 3A, an electron transmission spectrum was calculated by performing tight-binding density functional theory calculations based on a Slater-Koster method, and a phonon transmission spectrum was calculated by performing molecular mechanics calculations based on a reaction force field. As calculation results, considering that it was reported that good noise equivalent power was obtained in a range of $1.0 \times 10^{-5}$ to $1.8 \times 10^{-4}$ of carbon nanotubes in a carbon nanotube-based THz wave detector, it can be seen that the layered $Ti_3C_2$ material has excellent properties as a material for a photo-thermoelectric-type THz wave detecting sensor.

Figure 4A:
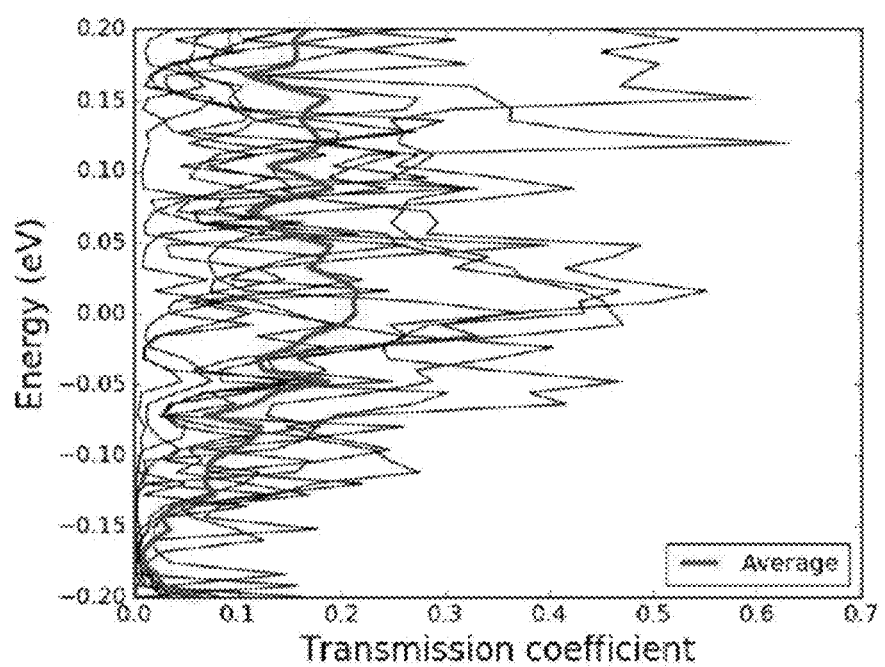
FIGS. 4A and 4B illustrate a transmission spectrum according to an energy level of electrons in monolayer Ti$_3$C$_2$ materials having temperatures of 300 K and 400 K.
Figure 4B:
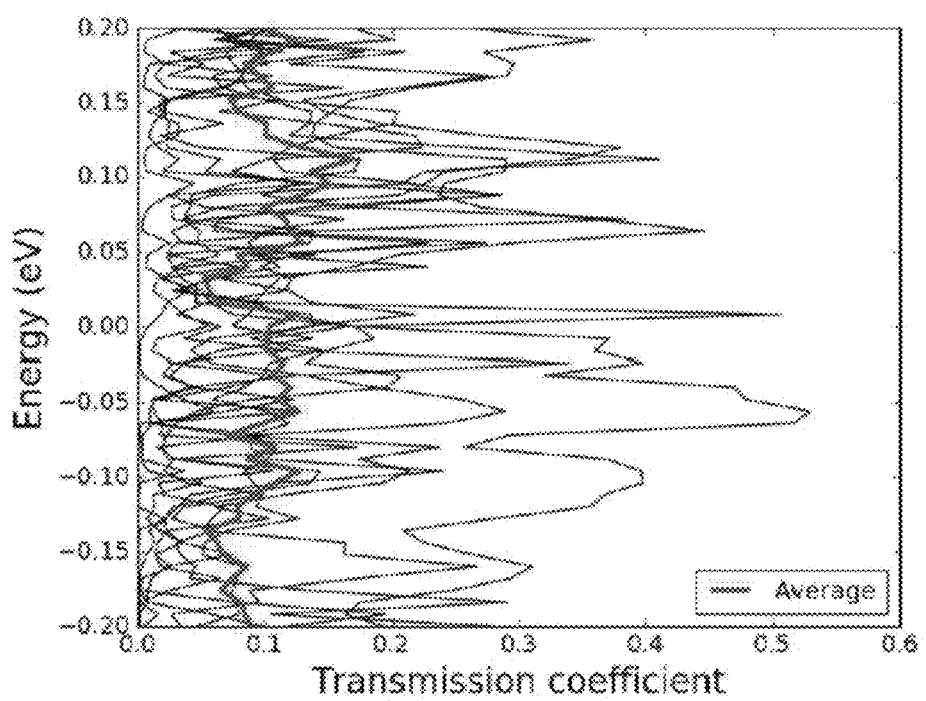

Next, electrical resistivity according to a temperature of a monolayer $Ti_3C_2$ material in which —O and —OH functional groups are bond to a surface thereof was calculated using a molecular dynamics-Landauer method. FIGS. 4A and 4B illustrate transmission spectra (black color) according to an energy level of electrons and averages (red color) of the transmission spectra with respect to different atomic structures sampled from the monolayer $Ti_3C_2$ material which were obtained by performing a molecular dynamics simulation nine times at temperatures of 300 K and 400 K. The electrical resistivity of the monolayer $Ti_3C_2$ material obtained from calculation results was 3.74E−05 Ωm and 6.58E−05 Ωm, and it could be seen that a change in electrical resistivity according to temperature is very large. The large increase in electrical resistivity according to an increase in temperature means that electron-phonon coupling is greatly increased even when the MXene material is slightly heated, which indicates that photo-thermal conversion occurs more effectively. A cyclical accelerating process of such a heating and photo-thermal enhancement shows that very efficient photo-thermal conversion may occur in the MXene material with respect to light with very low energy like a THz wave.

A THz wave detecting sensor according to the present invention can detect a THz wave at high sensitivity and can be applied to an application apparatus for detecting the THz wave, thereby maximizing efficiency. Specifically, it is possible to provide a THz wave detecting sensor capable of efficiently detecting a THz wave even in a simple form by using excellent optical absorption, excellent photo-thermal conversion efficiency, and excellent photo-thermoelectric conversion efficiency of a MXene material with respect to the THz wave and to provide a THz wave detecting device including the THz wave detecting sensor. In particular, the MXene material having a structure in which two-dimensional materials are stacked can effectively perform photothermal conversion on THz laser light, i.e., a THz wave that is instantaneously and intensively incident thereon. In addition, the MXene material can be easily manufactured into a thin film. Thus, a temperature of the MXene material can be effectively raised to maximize detection efficiency of the THz wave. High DOS near the Fermi energy level provided by the MXene material can maximize detection efficiency of the THz wave in low power THz laser light generally used in THz spectroscopy as well as in high power THz laser light used in THz imaging technology.

What is claimed is:

1. A terahertz (THz) wave detecting device comprising a sensor including an MXene material represented by the following Formula 1 as a sensing material:

$$M_{(n+1)}X_n, \quad \text{Formula 1}$$

wherein, in Formula 1, M is at least one of Sc, Ti, V, Cr, Zr, Nb, Mo, Hf, or Ta, X is at least one selected from C and N, and n is an integer selected from 1 to 3, and wherein the THz wave detecting device is a bolometer-type THz wave detecting device.

2. The THz wave detecting sensor of claim 1, wherein the MXene material has a two-dimensional monolayer structure, or a layered structure in which two-dimensional MXene materials are stacked.

3. The THz wave detecting device of claim 1, wherein the MXene material includes at least one selected from among $Ti_2C$, $Ti_3C_2$, $Ti_4C_3$, or $Mo_2TiC_2$.

4. The THz wave detecting device of claim 1, wherein the MXene material is dispersed in a polymer matrix.

5. The THz wave detecting device of claim 1, wherein the THz wave detecting device has a structure in which the THz wave detecting sensor and an antenna are coupled.

6. The THz wave detecting device of claim 5, wherein the THz wave detecting sensor to which the antenna is coupled is provided in a form in which a plurality of the above mentioned THz wave detecting sensors are connected in series or in parallel.

7. The THz wave detecting device of claim 5, wherein the THz wave detecting sensor to which the antenna is coupled includes an array comprising a plurality of the above mentioned THz wave detecting sensors connected in series or in parallel.

8. The THz wave detecting device of claim 1, wherein the THz wave detecting device is characterized in that a metamaterial is coupled to the THz wave detecting sensor.

9. A terahertz (THz) wave detecting device comprising a sensor including a MXene material represented by the following Formula 1 as a sensing material:

$$M_{(n+1)}X_n,\qquad\text{Formula 1}$$

wherein, in Formula 1, M is at least one of Sc, Ti, V, Cr, Zr, Nb, Mo, Hf, or Ta, X is at least one selected from C and N, and n is an integer selected from 1 to 3, wherein the MXene material has a layered structure in which two-dimensional MXene materials are stacked, and wherein the THz wave detecting device is a photo-thermoelectric THz wave detecting device.

10. The THz wave detecting device of claim 9, wherein the MXene material includes at least one selected from among $Ti_2C$, $Ti_3C_2$, $Ti_4C_3$, or $Mo_2TiC_2$.

11. The THz wave detecting device of claim 9, wherein the MXene material is dispersed in a polymer matrix.

* * * * *